United States Patent
Poplack et al.

(10) Patent No.: US 7,908,465 B1
(45) Date of Patent: Mar. 15, 2011

(54) HARDWARE EMULATOR HAVING A SELECTABLE WRITE-BACK PROCESSOR UNIT

(75) Inventors: Mitchell G. Poplack, San Jose, CA (US); Mikhail Bershteyn, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 887 days.

(21) Appl. No.: 11/601,235

(22) Filed: Nov. 17, 2006

(51) Int. Cl.
*G06F 7/38* (2006.01)
*G06F 9/00* (2006.01)
*G06F 9/44* (2006.01)
*G06F 15/00* (2006.01)

(52) U.S. Cl. ...................................................... 712/227
(58) Field of Classification Search .................... 712/227
See application file for complete search history.

(56) References Cited

U.S. PATENT DOCUMENTS

| | | | |
|---|---|---|---|
| 5,551,013 A * | 8/1996 | Beausoleil et al. | 703/23 |
| 6,618,698 B1 * | 9/2003 | Beausoleil et al. | 703/23 |
| 6,832,185 B1 * | 12/2004 | Musselman et al. | 703/23 |

* cited by examiner

*Primary Examiner* — Eddie P Chan
*Assistant Examiner* — Corey Faherty
(74) *Attorney, Agent, or Firm* — Moser IP Law Group (57) ABSTRACT

A method and apparatus for emulating a hardware design comprising an instruction execution unit for executing at least one instruction, a memory for providing data to the instruction execution unit for processing into an output bit, and a write enable logic for controlling writing the output bit from the instruction execution unit to the memory. In this manner, the output bit produced by the instruction execution unit executing an instruction may be selectably stored in memory to facilitate efficient processing of conditional emulation operations.

20 Claims, 8 Drawing Sheets

HARDWARE EMULATOR HAVING A SELECTABLE WRITE-BACK PROCESSOR UNIT

BACKGROUND OF THE INVENTION

1. Field of the Invention

Embodiments of the present invention generally relate to a processor-based hardware emulation engine and, more particularly, to a selectable write-back processor based emulation system.

2. Description of the Related Art

Hardware emulators are programmable devices used in the verification of hardware designs. A common method of hardware design verification is to use processor-based hardware emulators to emulate the design. These processor-based emulators sequentially evaluate combinatorial logic levels, starting at the inputs and proceeding to the outputs. Each pass through the entire set of logic levels is known as a cycle; the evaluation of each individual logic level is known as an emulation step.

An exemplary hardware emulator is described in commonly assigned U.S. Pat. No. 6,618,698 titled "Clustered Processors In An Emulation Engine", which is hereby incorporated by reference in its entirety. Hardware emulators allow engineers and hardware designers to test and verify the operation of an integrated circuit, an entire board of integrated circuits, or an entire system without having to first physically fabricate the hardware.

The complexity and number of logic gates present on an integrated circuit has increased significantly in the past several years. Hardware emulators need to improve in efficiency to keep pace with the increased complexity of integrated circuits. The speed with which a hardware emulator can emulate an integrated circuit is one of the most important benchmarks of the emulator's efficiency, and also one of the emulator's most important selling factors in the emulator market.

A hardware emulator is comprised of multiple processors. The processors are arranged into groups of processors called clusters, and the clusters of procesors collectively comprise the emulation engine. During each process step, each processor is capable of emulating a logic gate, mimicking the function of a logic gate in an integrated circuit. The processors are arranged to compute results in parallel, in the same way logic gates present in an integrated circuit compute many results in parallel. This creates a chain of logic similar to what occurs in an integrated circuit. In the chain of logic, efficient communication between processors is crucial.

The programs executed by the processors in a hardware emulator consist of instructions containing a sequence of operations. Certain operations act directly upon data, while other operations describe the conditions necessary for the data to be acted upon. For example, consider the sequence of operations described by equation 1:

if (a!=0)

$$b=c+d \qquad (1)$$

The operation "b=c+d" (b equals c plus d) acts upon the data element "b" using "c" and "d" as operands. The operation "a!=0" (a does not equal zero) describes the condition necessary for data element "b" to be acted upon.

Evaluating conditional operations such as the one described above was previously impossible for a hardware emulator. Therefore, a compiler converts such conditional operations into logically equivalent non-conditional operations. For example, if a, b, c and d are Boolean operands, the above conditional operation may be rewritten as equation 2:

$$b=a\&(c+d)|!a\&b \qquad (2)$$

There is a drawback to rewriting the sequence of operations shown by equation 1 as the sequence of operations shown by equation 2. Only three memory read ports, i.e., read ports to retrieve the values of a, c and d, are required by a processor to evaluate the first equation. Four memory read ports, i.e., read ports that retrieve the values of a, b, c and d, are required by a processor to evaluate the second equation.

A processor may have to evaluate an instruction that contains a greater number of operands than the processor has read ports. For example, a processor may have four read ports and need to evaluate an instruction word containing six operands. Such an instruction word requires evaluation by at least two processors. The processors may produce several intermediary values during the evaluation of such an instruction word. These intermediary values are of limited use and it would be more beneficial to overwrite the final value stored in memory only when the new final value is different from the value stored in memory.

Thus, there is a need in the art for a processor unit having a selectable write-enable to a memory. The selectable-write enable memory allows the processor unit to write the evaluated output of an instruction word to the memory or maintain the memory in its present state.

SUMMARY OF THE INVENTION

The present invention generally relates to an improved processor-based emulation engine. A method and apparatus for providing a selectable-write enable function in an emulation engine is described. The method and apparatus comprises an instruction execution unit for executing at least one instruction, a memory for providing data to the instruction execution unit for processing into an output bit, and a write enable logic for controlling writing the output bit from the instruction execution unit to the memory. In this manner, the output bit produced by the instruction execution unit executing an instruction may be selectably stored in memory to facilitate efficient processing of conditional emulation operations.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention is an improved method and apparatus that uses a processor unit having a selectable write-enable memory to increase the efficiency of an emulation engine. An exemplary emulation engine is disclosed in U.S. Pat. No. 6,618,698 "Clustered Processors In An Emulation Engine" and U.S. Pat. No. 5,551,013 "Multiprocessor For Hardware Emulation" which are hereby incorporated by reference in their entirety.

Figure 1:
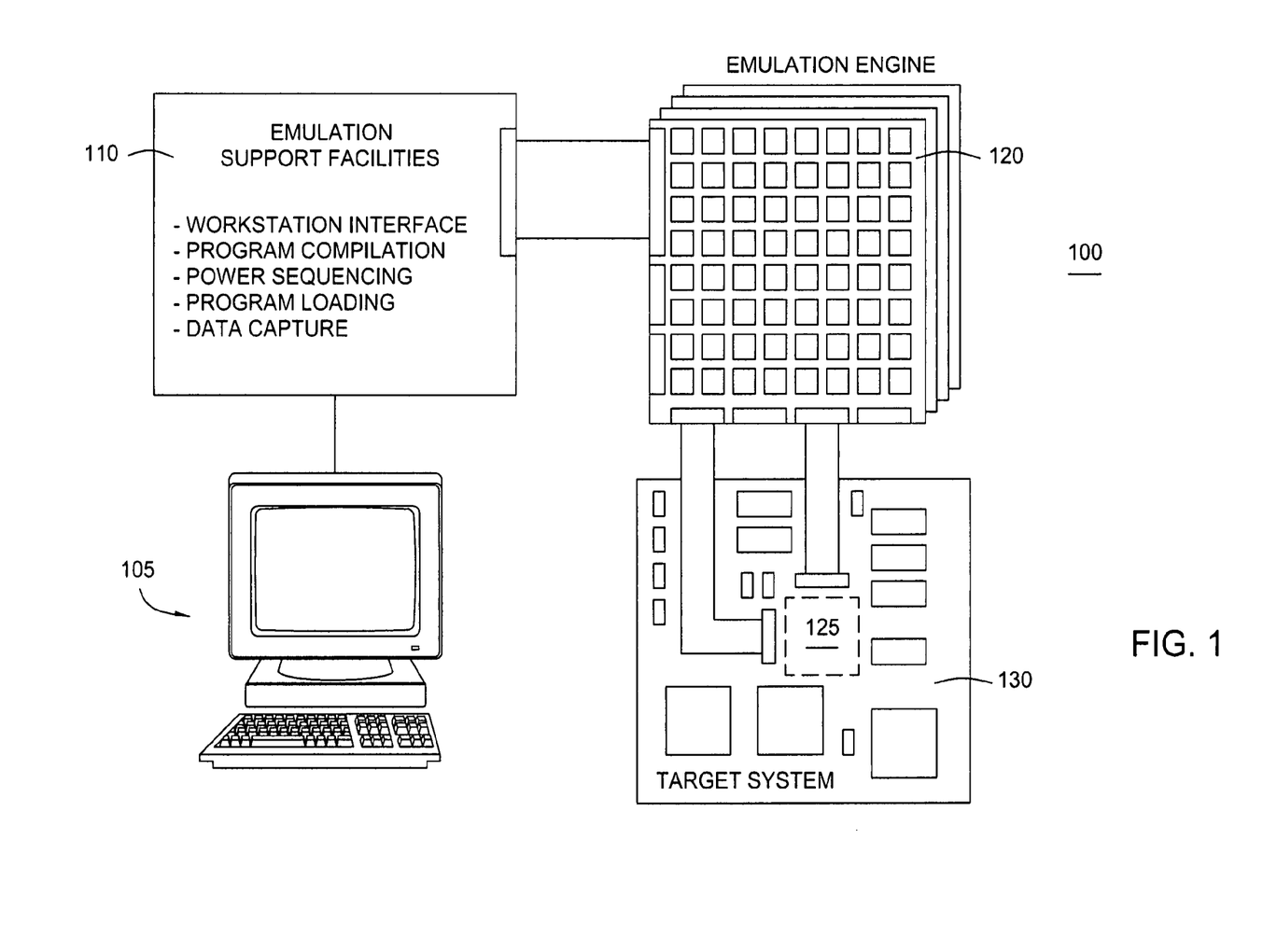
FIG. 1 is a general overview of a hardware emulation system.

FIG. 1 is an overview of an emulation system 100. The system comprises a computer workstation 105, emulation support facilities 110, an emulation engine 120 and a target system 130. The computer workstation 105 is coupled to the emulation support facilities 110. The computer workstation 105 allows a user to interface with the emulation engine 120, control the emulation process and collect emulation results for analysis. The emulation support facilities 110 provide a workstation interface, program compilation, power sequencing, program loading and data capture. Under control of the computer workstation 105, programming information and data is loaded to the emulation engine 120 from the support facilities 110.

In response to the programming received from the emulation support facilities 110, the emulation engine 120 emulates a portion 125 of the target system 130. The portion 125 of the target system 130 may be an integrated circuit, a memory, a processor, or any object or device that can be emulated in a programming language. Popular emulation programming languages include Verilog and VHDL.

Figure 2:
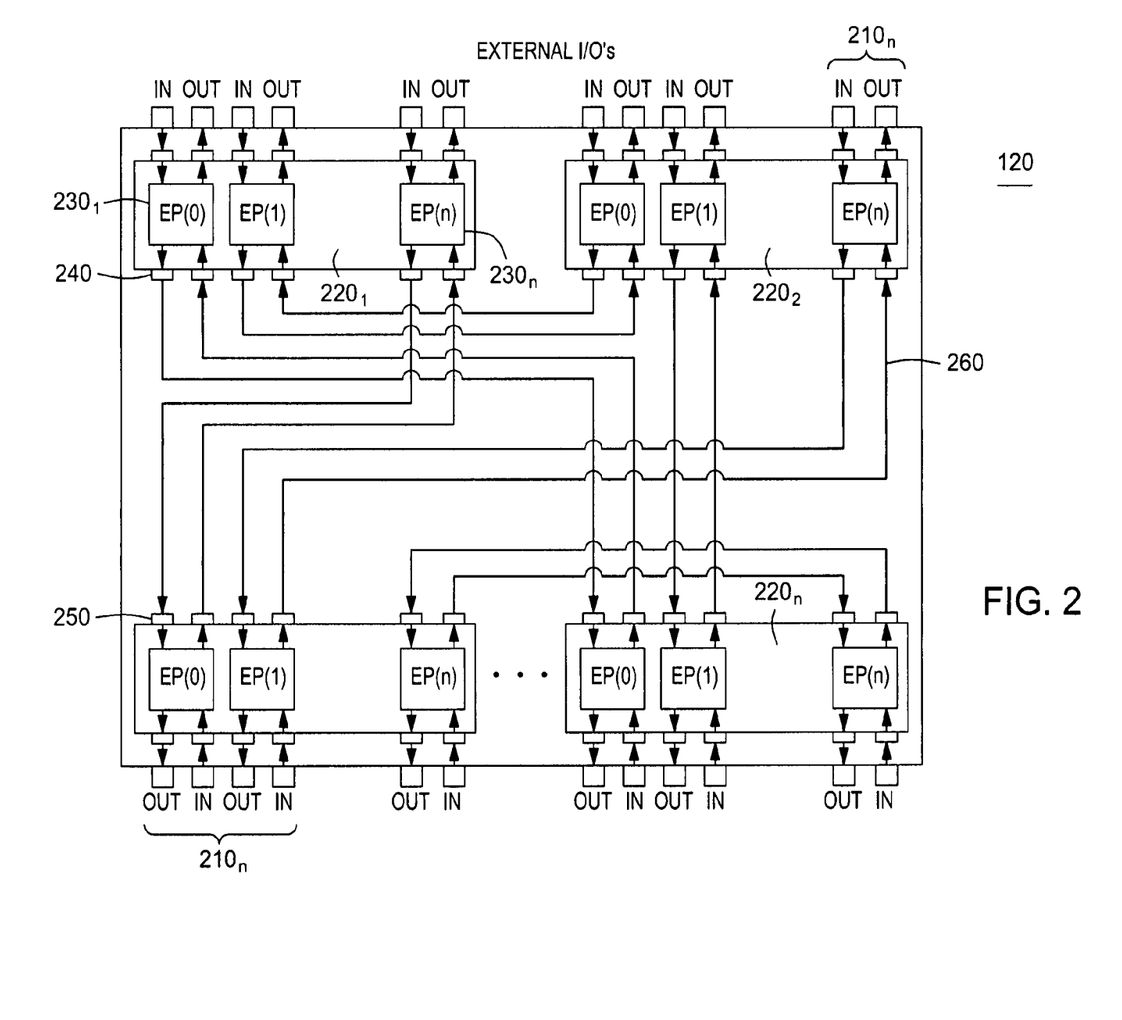
FIG. 2 is a block diagram of a hardware emulation board.

FIG. 2 is a block diagram of an emulation engine 120. The emulation engine 120 comprises clusters 220 of processor modules 230. The emulation engine 120 communicates with the target system (130 in FIG. 1) and the emulation support facilities (110 in FIG. 1) through multiple inputs and outputs, collectively $210_n$ (where n is an integer). Each cluster 220 comprises multiple processor modules $230_n$ (where n is an integer) and multiple cluster inputs 250 and cluster outputs 240. The outputs 240 of each cluster 220 connect directly to the inputs 250 of the other clusters 220 within the emulation engine 120.

An emulation engine 120 contains multiple processor modules $230_n$. All processor modules $230_n$ within the emulation engine are identical. In one embodiment of the invention, a processor module $230_n$ emulates either a four input logic function, or a memory array access according to an emulation program provided by the emulation support facilities (110 in FIG. 1). The output data of a processor module $230_n$ is made available to other processor modules $230_n$ and processor module clusters 220 via interconnections 260 within the emulation engine 120.

Figure 3:
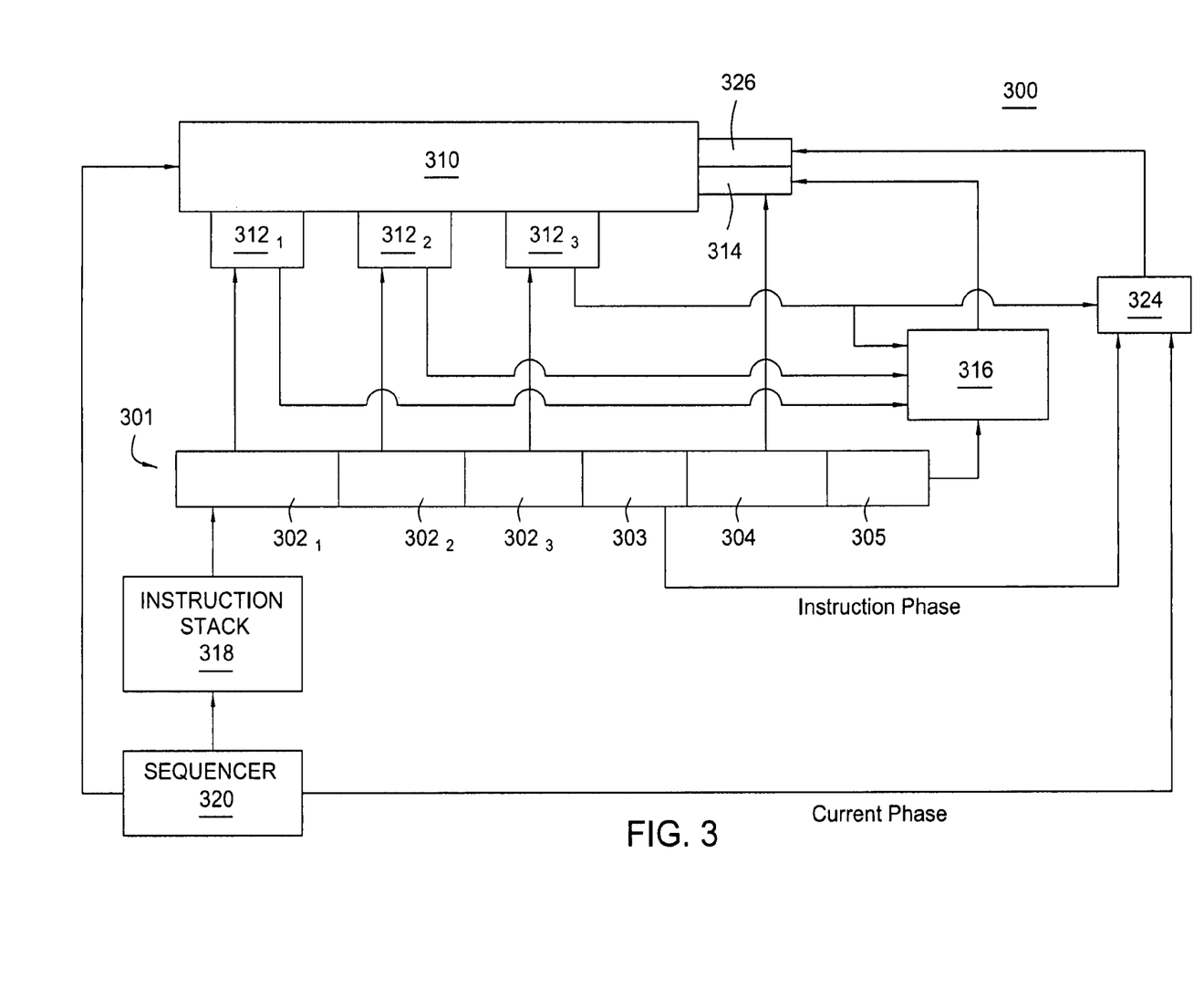
FIG. 3 is a block diagram of an emulation processor unit in accordance with one embodiment of the present invention.

FIG. 3 depicts an emulation processor unit 300 in accordance with one embodiment of the present invention. The emulation processor unit 300 comprises a memory 310 (also referred to as a data array), an instruction execution unit 316, an instruction stack 318, a sequencer 320 and write control logic 324. In this embodiment, the data array 310 comprises a plurality of read ports 312 and has a write enable port 326 that can be used to control the write function of the data array in accordance with the present invention.

The instruction execution unit 316 is coupled the memory 310. The instruction execution unit 316 evaluates data supplied from the memory 310. The sequencer 320 is connected to the instruction stack 318, the memory 310 and the write control logic 324. The sequencer 320 provides sequential write addresses to the memory 310 (these addresses may alternatively be provided by an instruction word from the instruction stack 318), provides read addresses to the instruction stack 318 and phase bits to the write control logic 324.

The instruction stack 318 stores instruction words $301_1$ to $301_n$, where n is the maximal depth of the instruction stack 318. Each instruction word 301 comprises a plurality of fields 302, 303, 304, 305 containing information to control the emulation during one step in a cycle. The sequencer 320 provides read addresses to the instruction stack 318 that cause the instruction stack 318 to sequentially output one instruction word per emulation step. Each increment of the sequencer 320 causes the step value to advance from zero to a predetermined maximum value and corresponds to one design path clock cycle for the emulated design.

In one embodiment, the instruction word 301 comprises operand address fields $302_1$ and $302_2$, enable address field $302_3$, phase field 303, result address field 304 and instruction field 305. The operand address fields $302_1$ and $302_2$ are applied to data read ports $312_1$ and $312_2$ of the memory 310. In response to receiving operand address fields $302_1$ and $302_2$, the data read ports $312_1$ and $312_2$ provide operand (data) values to the instruction execution unit 316. The instruction execution unit 316 evaluates the operand values in accordance with instruction field 305 and produces, in response, a function bit out and provides the function bit out to write port 314 of the data array 310.

The enable address field $302_3$ is applied to data read port $312_3$ of the data array 310. The data read port $312_3$ provides an enable bit (or bits) to the write enable logic 324 and the execution unit 316. In this manner a user may include a write enable in the instruction word 301 to facilitate user control of the write function.

The write enable logic 324 also receives phase bits (current phase) from the sequencer 320. In one embodiment of the invention, the phase bits are a three-bit binary sequence, i.e., 000 to 111. The instruction phase field 303 of the instruction word 301 is read at data port $312_3$ of the memory 310. The use of the phase bits (current phase and instruction phase) is described in more detail with reference to FIG. 8, below. The write enable logic 324 uses the phase information and the write enable bit(s) to determine whether the current output bit is to be written to memory 310 or not.

The result address field 304 of the instruction word 301 is applied to the write port 314 of the memory 310 to select a memory address to use for the write operation. In some embodiments, a result address field would not be used. In such embodiments, the address of the instruction word is used as the location for storing the result of the processing. If a result address field is not used, the instruction word is shortened by the length of the result address field i.e.; field 304 does not exist. The output of the write enable logic 324 contains an "enabling bit" that is applied to the write-enable part of the memory 310 to control the write-back operation. When the "enabling bit" is set to "on", the memory 310 is enabled to store the processed bit produced by the instruction execution unit 316. Upon being enabled, the processed bit is stored at an address in the memory 310 supplied by the result field 304 of the instruction word 301. When the "enabling bit" is set to "off", the processed bit output by the instruction execution unit 316 is not written to the memory 310, i.e., the previously generated bit is maintained.

Figure 8:
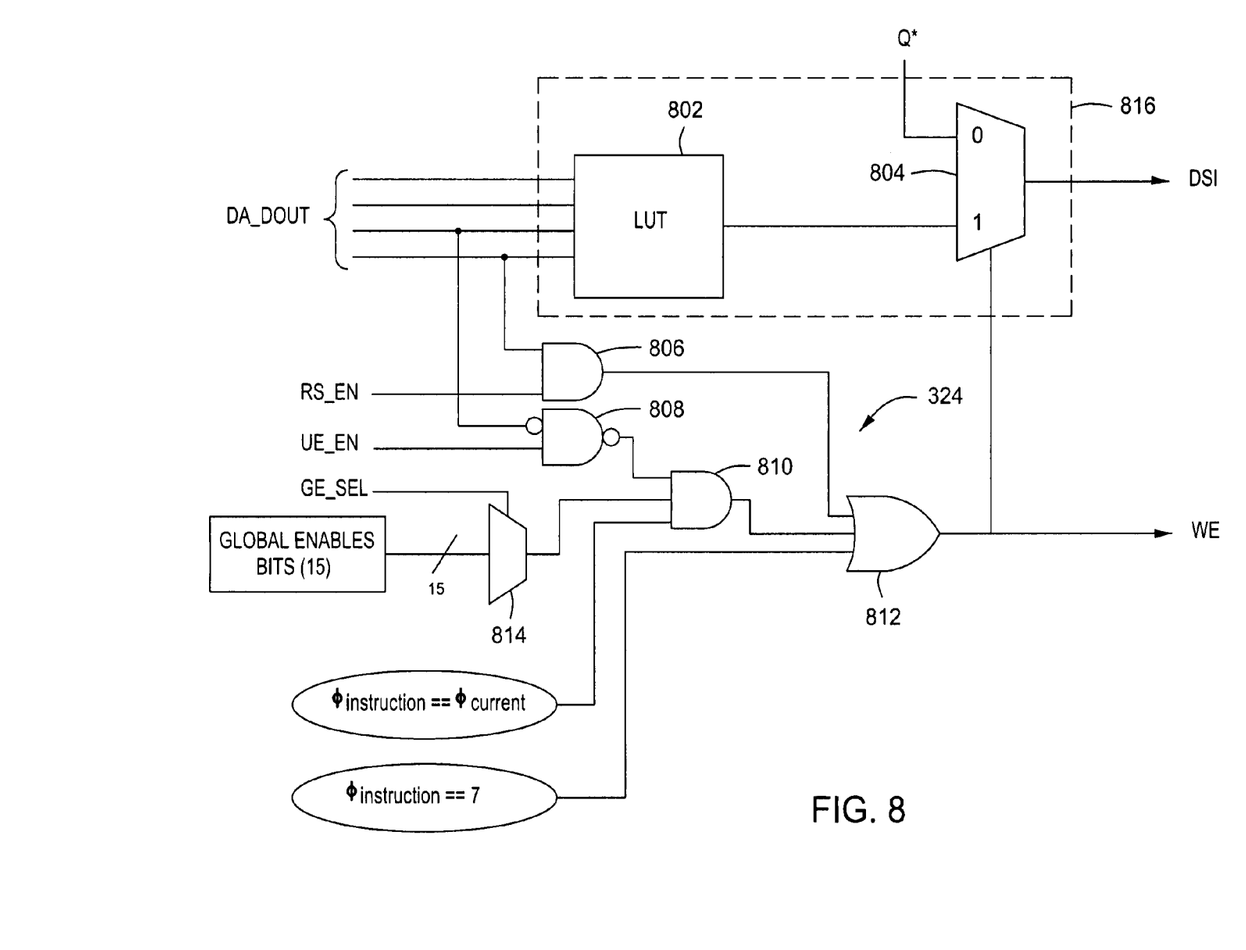
FIG. 8 is a detailed schematic diagram of a portion of the embodiments of FIGS. 3, 4 and 5.

FIG. 8 depicts one embodiment of a schematic diagram of the instruction execution unit 316 and the write enable logic

324. The instruction execution unit 316 comprises a look up table (LUT) 802 that has a function (contents) that is established by the instruction (instruction field 305) within the instruction word 301. The input to the LUT 802 includes the data (DA_OUT) from the memory 310 (4 bits). The one-bit output of the LUT 802 is coupled to a multiplexer 804 that selects between a prior LUT output (Q*) and the current output. This selection process is controlled by a write enable (WE) signal produced by the write enable logic 324.

The write enable logic 324, in one illustrative implementation, comprises AND gate 806, NAND gate 808, triple input AND gate 810, triple input OR gate 812, and multiplexer 814. The inputs to the logic 324 comprise various control signals including reset enable (RS_EN), user enable (UE_EN), global enable select (GE_SEL), Global Enable Bits (15 bits), and phase information (both instruction phase and current phase). The values of the control signals (RS_EN, UE_EN, GE_SEL) are generated by the enable address field of the instruction word addressing a particular address in the data array. The resulting information that is accessed from the memory 310 is a combination of bits assigned to the signals: one bit each for the RS_EN, and UE_EN four bits for the GE_SEL and fifteen bits for the Global Enable Bits. The phase information is supplied from the instruction word and the sequencer.

In one embodiment of the invention, the instruction execution unit 316 operates in two modes: 1) as a flip-flop and 2) as a combinational gate. When operating as a flip flop, the instruction word sets RS_EN or UE_EN or both. If RS_EN is set, then the instruction execution unit 316 becomes a flip-flop with an asynchronous set or reset (often referred to as a preset and clear) and one of the DA_OUT signals is used as the preset and clear signal. This arrangement is implemented because if an asynchronous preset/clear signal is asserted, then writeback of the result needs to be forced to occur because the output of the flop is supposed to change regardless of the state of the enable signals.

Aside from asynchronous preset/clear, there are three controlling conditions which determine when the write operation should occur. The first condition is that the phase (instruction and current) must match, the second condition is that the global enable must be set and the third condition is that the user's enable is set.

The first condition uses the phase information. Phase information is used to expand functionality of the execution unit 316. For example if a design needs to run through the instruction stack multiple times to complete an emulation cycle (generally, because the stack is not deep enough to accommodate all the instructions for a cycle), then each pass through the instruction stack is performed using a different current phase. As such, the state of the flip flop is only updated during one full pass through the instructions comprising a cycle, i.e., while the current and instruction phases are matched. Phase information can also be used to execute multiple designs within a single instruction stack.

The second condition requires appropriate setting of the global enable bits. If, for example, the design uses "instrumentation enables" due to some artifact of how the circuit is modeled, then a gating signal or signals is generated so that the user's state of the design doesn't advance every cycle. As such, the pre-compile of the instructions would generate a "global enable" for this situation. In another example, the design may use multiple clocks, e.g., where one clock is twice as fast as another clock. Consequently, the flip-flops using the slower clock must be controlled to only change every second cycle. Global enable bits are used to control this functionality. Additionally, if the design uses a high number at fanout enables, these can be efficiently implemented using the global enables. The global enable function can be disabled by setting the GE_SEL bits to 1111 which produces a 1 at the output of the GE_SEL multiphaser 814.

The third condition finds use when the design models a flip-flop with an enable. As such, the UE_EN signal is set and a DA_OUT signal becomes the enable control signal.

In the combinational gate mode, the instruction phase is set to 7 and Q* is a "don't care". The user enable bit is used by the instruction word to determine whether the write enable (WE) is active or not. The use of the user enable signal to control whether the new output of the instruction execution unit 316 is written to memory or not is determined by the function being performed, e.g., is the value an intermediary value that facilitates implementation of a conditional function.

Figure 4:
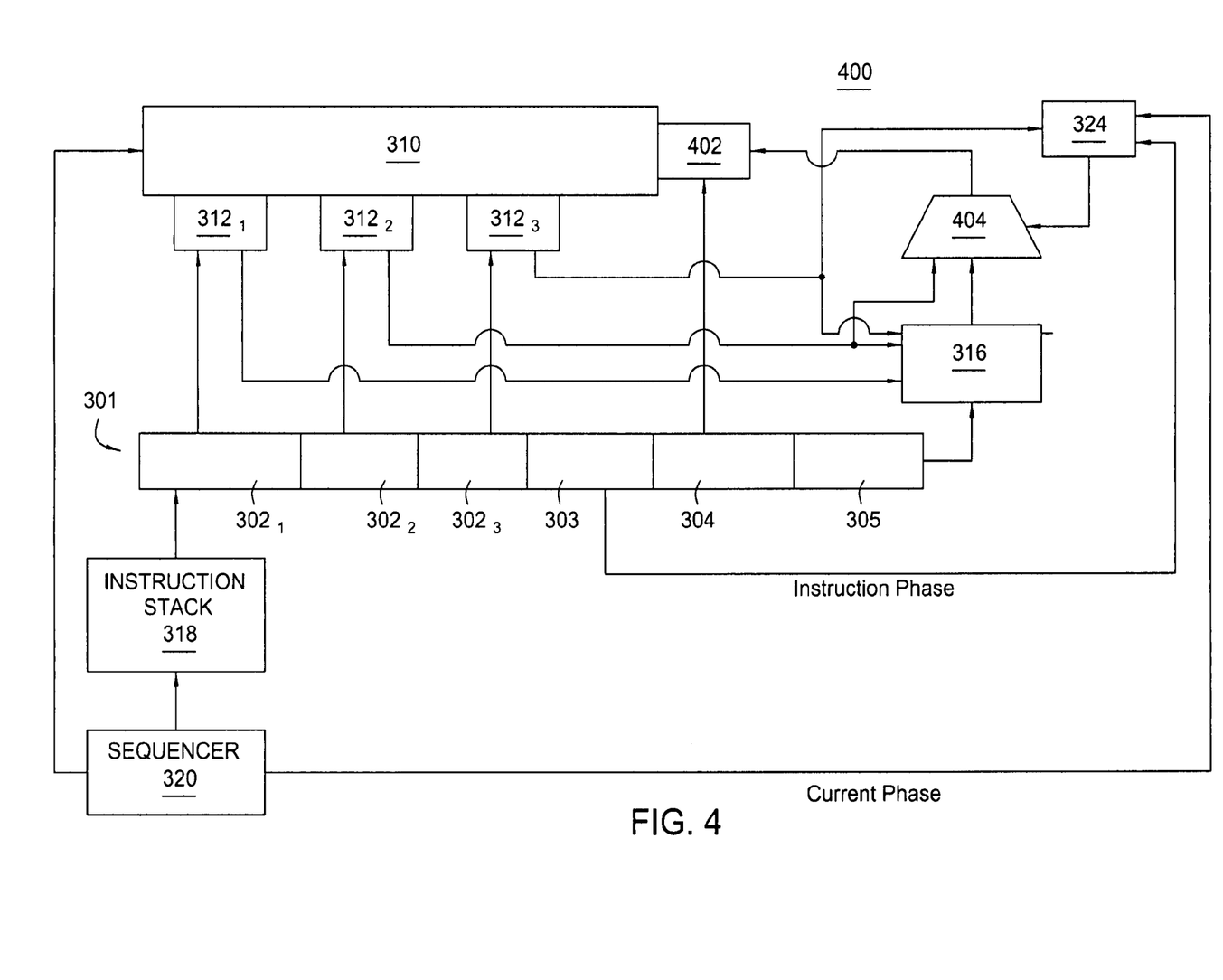
FIG. 4 is a block diagram of an emulation processor unit in accordance with one embodiment of the present invention.

FIG. 4 depicts an emulation processor unit 400 in accordance with another embodiment of the present invention. The emulation processor unit 400 includes a memory 310, an instruction execution unit 316, an instruction stack 318, write enable logic 324, a sequencer 320, and a selector logic 324. In this embodiment, the memory 310 does not have a write enable port to control write port 402. As such, the selector logic 404 selects between the output of the instruction execution unit 316 or the output of read port 312$_2$ of memory 310, i.e., select a prior output or the current output. The operation of the emulation processor unit 400 is identical to that of unit 300 in FIG. 3 and FIG. 8, except without a write enable port on the memory 310 such that the write enable control function must be provided external to the memory 310. This function is provided by selector 404. Selector 404 has as inputs the current output of the instruction execution unit 316 and a prior output of unit 316 stored in memory. Additionally, the write enable signal from the logic 324 is used to select which input is to be applied to the write port 402 and written to the memory 310.

Figure 5:
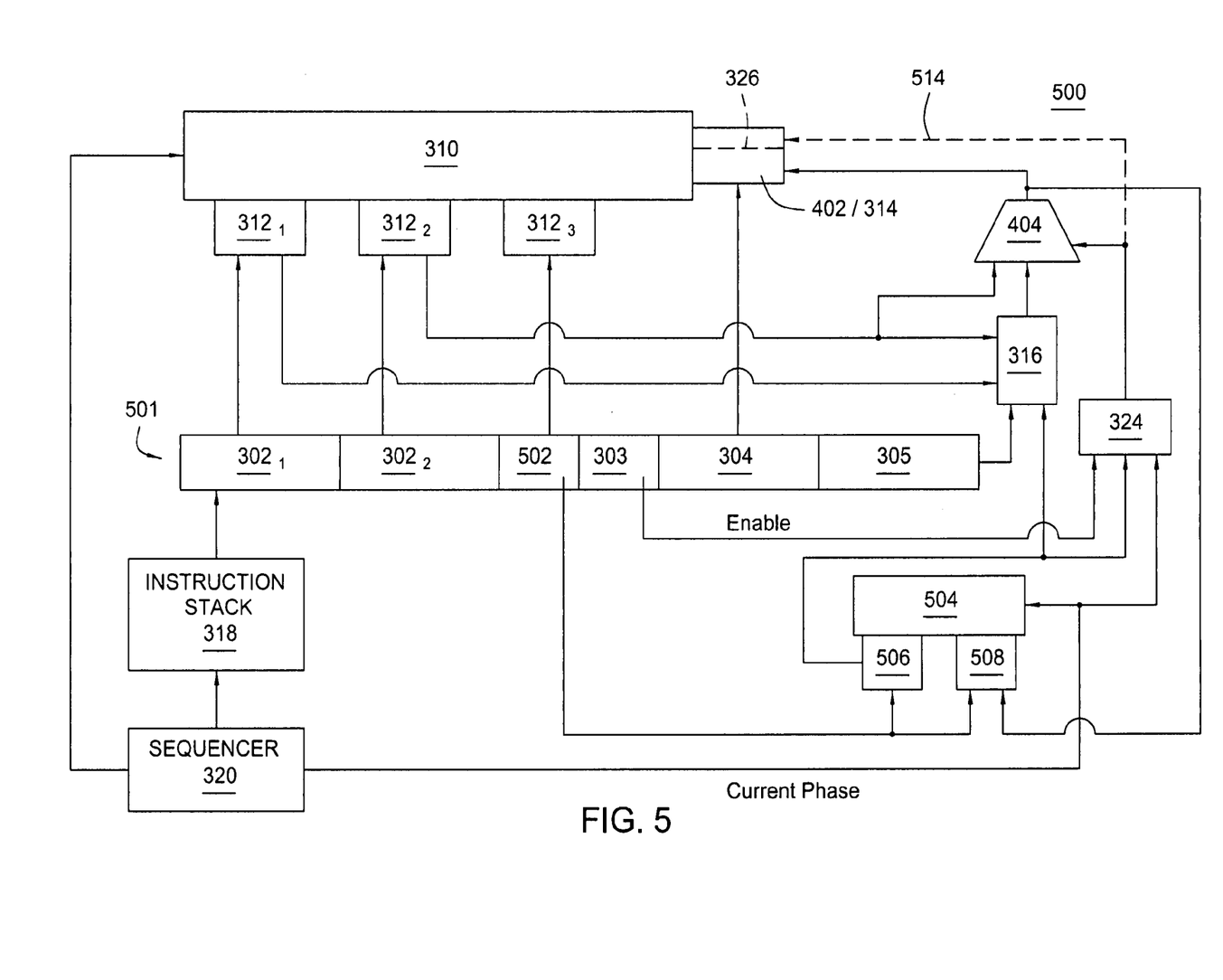
FIG. 5 is a block diagram of an emulation processor unit in accordance with one embodiment of the present invention.

FIG. 5 depicts an emulation processor unit 500 in accordance with another embodiment of the present invention. The emulation processor unit 500 includes a memory 310, an instruction execution unit 316, an instruction stack 318, a sequencer 320, a write enable logic 324, selector 404 and selection memory 504.

The selection memory 504 stores the "enable bits" that are used to select the output of the selector 404 or set the write enable bit for the write enable logic 324. Storing the "enable bits" in the selection memory 504 saves space in the memory 310 for storing processed data. For simplicity, the selection memory 504 is shown as an additional feature of the processor unit 400 depicted in FIG. 4. However, one skilled in the art will appreciate that the selection memory 504 can be an additional feature of the processor unit 300 depicted in FIG. 3 (as represented by the dashed line 510 that bypass the selector 404).

The selection memory 504 includes a data read port 506 and a data write port 508. The data read port 506 reads a value at the address provided in the enable address field 502 of the instruction word 501. The data read port 506 produces the enable bit(s) for the write enable logic 324 and the instruction execution unit 316. The bits are used in the manner described with respect to FIGS. 3, 4, and 8 above.

The enable address field 502 also provides a write address to the memory 504. Also coupled to the write port is the output data that is to be written to the memory 310. In this manner, the instruction execution unit 316 can be used to dynamically generate new enable bits (i.e., an output bit used as a subsequent enable bit) and store the bits in the memory 504.

Figure 6:
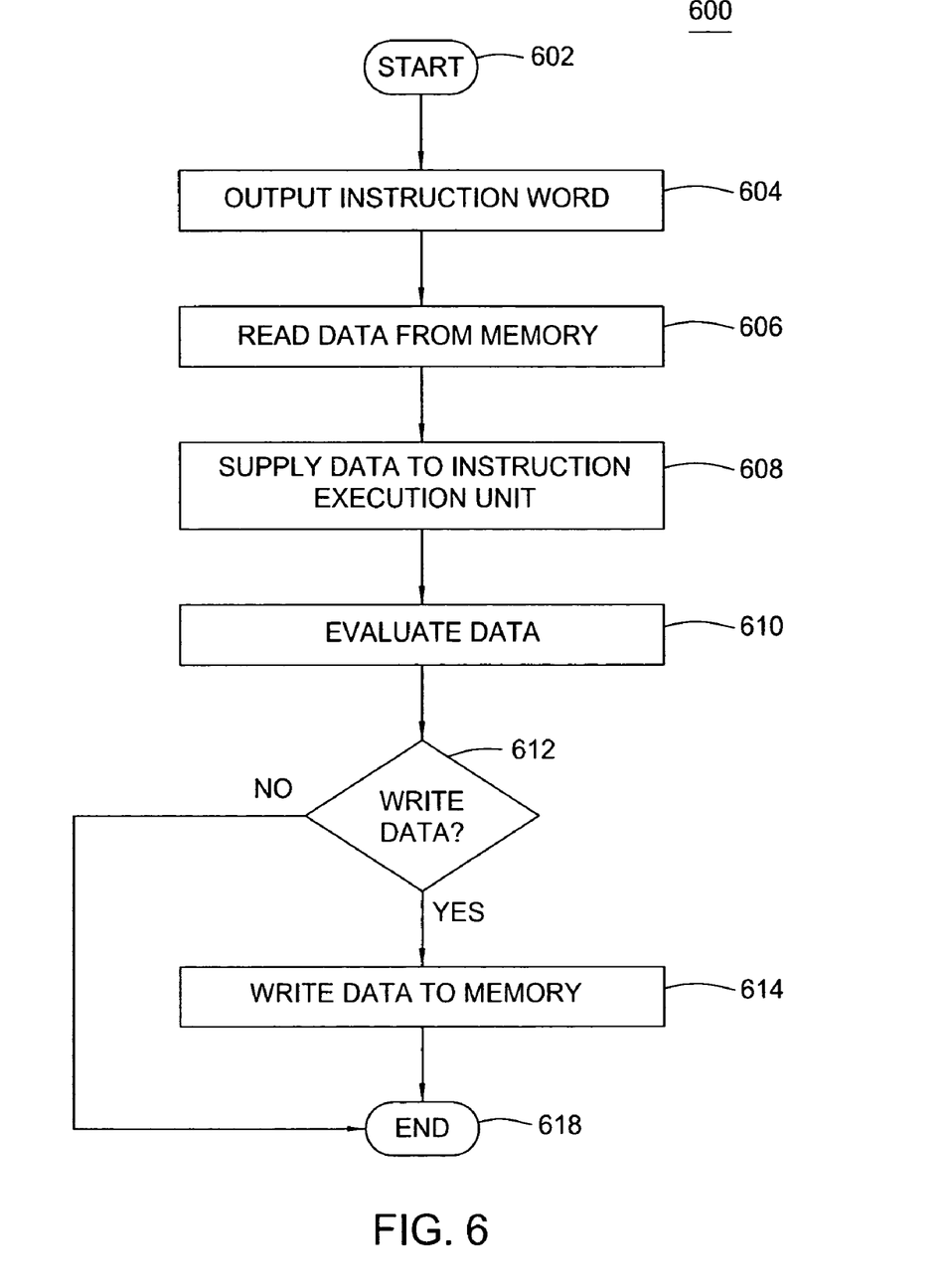
FIG. 6 is a flow diagram of a method that utilizes one embodiment of the present invention.

FIG. 6 is a flow diagram of a method 600 representing the operation of the embodiment of the invention shown in FIG. 3. The method 600 begins at block 602 and proceeds to block

604. At block 604, the sequencer 320 causes the instruction stack 318 to produce an instruction word 301. At block 606, data is read from a memory 310 using the instruction word 301. The read address for the memory 310 is contained within operand fields 302$_1$ and 302$_2$ of instruction word 301.

At block 608, the data read from the memory 301 is supplied to instruction execution unit 316. At block 610, the instruction execution unit 316 evaluates the data using an instruction field contained within the instruction word 301.

At decision block 612, the memory 310 chooses between writing the evaluated data to the memory 310 or leaving the memory 310 unchanged. The decision is controlled by an enable address field 303 in the instruction word 301. The method 600 proceeds to block 614 if the "enable bits" indicate that the instruction execution unit should write to the memory 310. As such, the memory 310 is enabled to store the evaluated data produced by the instruction execution unit 316. The method 600 proceeds to block 616 if an "enable bit" within the value determined by the enable address field 303 is set to off, then the memory 310 ignores the data produced by the instruction execution unit 316 and the memory 310 remains unchanged. The method ends at block 618.

Figure 7:
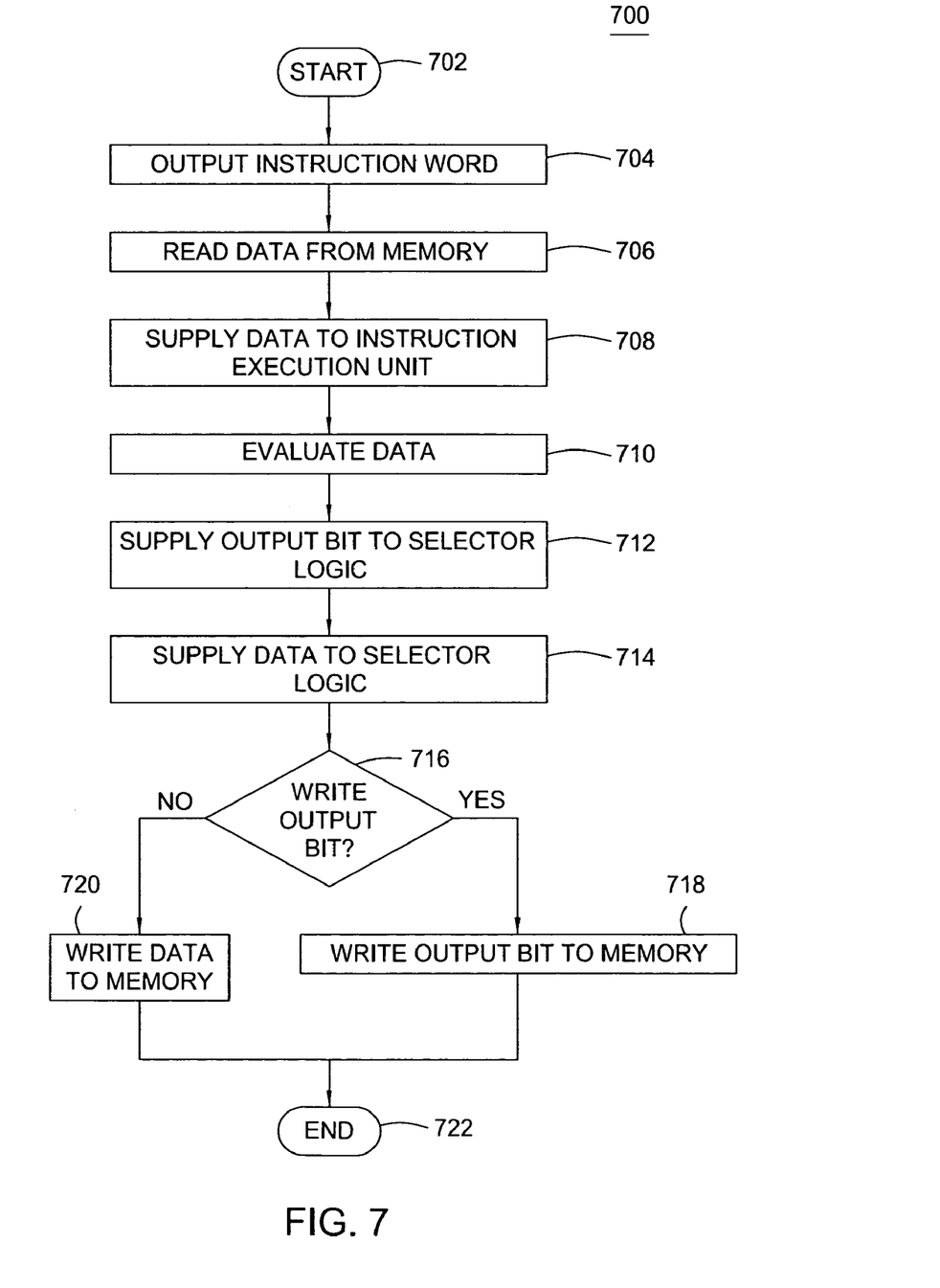
FIG. 7 is a flow diagram of a method that utilizes one embodiment of the present invention.

FIG. 7 is a flow diagram of a method 700 of operation of the either the embodiment of the invention shown in FIG. 4 or FIG. 5. The method 700 starts at block 702 and proceeds to block 704.

At block 704, the sequencer 320 causes the instruction stack 318 to produce an instruction word 301/501. At block 706, data is read from a memory 310 using read addresses within the instruction word 301/501. The read address for the memory 310 is contained within operand fields 302$_1$ and 302$_2$ of instruction word 301/501.

At block 708, the data read from the memory 310 is supplied to instruction execution unit 316. At block 710, the instruction execution unit 316 evaluates the data using an instruction field contained within the instruction word 301/501 to produce an output bit. At block 712, the output bit is supplied to a selector logic 404. In one embodiment of the invention, the selector 404 is a multiplexer. At block 714, one of the inputs to the instruction execution unit 316 is also supplied to the selector 404 (e.g., a data input to the unit 316 is coupled to the selector 404).

At decision block 716, the selector 404 selects between the output bit supplied by instruction execution unit 316 and the data read from the memory 310. The method 700 proceeds to block 718 if the selector selects the output bit wherein the selector 404 supplies the output bit to the memory 310. Otherwise, the method 700 proceeds to block 720 and the selector 404 supplies one of the inputs (e.g., a prior output bit) to the instruction execution unit 316 to the memory 310. The method 700 ends at block 722.

The present invention may use enable signals to make multi-phase model evaluation more efficient. Multi-phase model evaluation is required in processor-based emulation systems when the model contains a longer chain of data-dependent operations than the instruction memory size can accommodate. The evaluation of such chains of dependent operations is performed by cyclically executing the same instruction sequence several times. For example, consider a chain of dependent data elements comprised of $D_1, D_2, \ldots D_N$, where each operation that computes the value of $D_i$, uses as an operand a value of $D_{i-1}$, and the size of instruction memory is M<N and M>N/2. In order to compute the value of $D_N$, two sequences of operations executed in parallel in two different processors is required. One sequence comprises the computation of $D_1, \ldots, D_M$, and another sequence comprises the computation of $D_{M+1}, \ldots, D_N$. After this combined sequence is run twice, all values will have been computed correctly.

A problem arises when computation of either sequence of operations has a destructive side effect. During the first run (first phase), the output of the sequence of operations is incorrect and should not be stored to a data array (memory 310). Specifically, any state element of the simplest form must be implemented by the sequence of operations:

if (STATE_UPDATE)

STATE=NEXT_STATE where STATE_UPDATE is a global signal applied to all such elements that need to be evaluated during a given phase, and indicates that the correct phase is in fact executing.

Prior art processors implement such a state element by the sequence of operations:

STATE=STATE_UPDATE&NEXT_STATE|!STATE_UPDATE&STATE;

which requires three read ports to access the data array. A processor unit that uses embodiment of the present invention, requires only one read port to access the data array (for NEXT_STATE signal). STATE_UPDATE is modeled by instruction enable signal, while STATE need not be read from the data array at all. The instruction enable signals also increase performance of the processor unit. Extraneous operations, such as writing or reading the data array twice when only once would suffice, can consume the bandwidth of the data array and deny it to more beneficial uses.

The reduction in the number of read ports required to evaluate certain sequences of operations according to present invention results in an overall size reduction in a compiled sequence of operations. Sequences of operations that store data to the data array are known as storage elements. Storage elements constitute on average 20% of the compiled sequence of operations. The present invention applied to storage elements alone results in a significant improvement of hardware emulator capacity and performance.

Thus, a processor unit having a selectable write-enable memory increases the efficiency of a processor-based emulation system. The present invention also decreases the overall size of the compiled sequence of operations evaluated by the emulation system and increases the amount of bandwidth available to the memory within the emulation system.

While the foregoing is directed to embodiments of the present invention, other and further embodiments of the invention may be devised without departing from the basic scope thereof, and the scope thereof is determined by the claims that follow.

What is claimed is:

1. Apparatus for emulating a hardware design comprising:
   an instruction execution unit for executing instructions;
   a memory for providing data to the instruction execution unit for processing into output bits; and
   a write enable logic for enabling a first output bit from the instruction execution unit to be written to the memory in response to an instruction phase value from an instruction matching a current phase value, and disabling a second output bit from the instruction execution unit from being written to the memory in response to an instruction phase value from another instruction not matching the current phase value.

2. The apparatus of claim 1 wherein the memory comprises at least one read port, at least one write port and at least one enable port, and the write enable logic is coupled to the at least one write enable port.

3. The apparatus of claim 1 further comprising a selector, coupled to the write enable logic, for selecting either the first output bit or a third output bit for writing to the memory.

4. The apparatus of claim 3 wherein the third output bit is a previously computed output bit.

5. The apparatus of claim 1 wherein an instruction word comprises addressing information for the memory to supply data and a respective instruction to the instruction evaluation unit.

6. The apparatus of claim 1 further comprising a sequencer that provides the current phase to the write enable logic.

7. The apparatus of claim 1 further comprising a selection memory, coupled to the write control logic and the instruction evaluation unit, for storing at least one enable bit used by the write control logic.

8. The apparatus of claim 1 wherein the instruction evaluation unit comprises a look up table (LUT) for evaluating data and a multiplexer for selecting the first output bit.

9. The apparatus of claim 1 wherein write control logic comprises a plurality of gates that determine an operational state of the instruction evaluation unit and, in response to the operational state, establish a write enable signal.

10. The apparatus of claim 9 wherein the operational state comprises a flip-flop or combinatorial logic.

11. The apparatus of claim 1 further comprising:
an instruction stack for storing the instructions; and
a sequencer, coupled to the instruction stack, for selecting from the instructions stored within the instruction stack.

12. The apparatus of claim 1 wherein the instruction execution unit, the memory and the write enable logic form at least a portion of a processing unit, and the apparatus comprises a plurality of processing units.

13. Apparatus for emulating a hardware design comprising:
an instruction stack for storing a plurality of instructions;
a sequencer, coupled to the instruction stack, for selecting instructions from the instruction stack;
an instruction execution unit for executing the selected instructions;
a memory for providing data to the instruction execution unit for processing into output bits in accordance with the selected instructions; and
a write enable logic for enabling a first output bit from the instruction execution unit to be written to the memory in response to an instruction phase value from a selected instruction matching a current phase provided by the sequencer, and disabling a second output bit from the instruction execution unit from being written to the memory in response to an instruction phase value from another selected instruction not matching the current phase value.

14. The apparatus of claim 13 wherein the memory comprises at least one read port, at least one write port and at least one enable port, and the write enable logic is coupled to the at least one write enable port.

15. The apparatus of claim 13 further comprising a selector, coupled to the write enable logic, for selecting either the first output bit or a previously computed output bit for writing to the memory.

16. A method for emulating a hardware design comprising:
providing a sequence of instructions to an instruction evaluation unit;
evaluating data, in accordance with instructions, to produce output bits from the instruction evaluation unit; and
generating a write control signal to enable a first output bit to be written to a memory in response to an instruction phase value from an instruction matching a current phase, and disable a second output bit from being written to the memory in response to an instruction phase value from another instruction not matching the current phase.

17. The method of claim 16 wherein the write control signal is coupled to a write enable port of the memory.

18. The method of claim 16 further comprising selecting, using the write control signal, the first output bit or a third output bit to be written to the memory.

19. The method of claim 18 wherein the third output bit is a previously computed output bit.

20. The method of claim 16 wherein each instruction in the sequence of instructions causes the instruction evaluation unit to emulate either a flip-flop or combinatorial gate.

* * * * *